United States Patent [19]
Maran et al.

[11] 3,942,075
[45] Mar. 2, 1976

[54] SEMI-CONDUCTOR THERMAL PROTECTION ARRANGEMENT

[75] Inventors: Richard I. Maran, Cote St. Luc, Canada; Robert S. Meijer, Chicago, Ill.

[73] Assignee: Multi-State Devices Ltd., Dorval, Canada

[22] Filed: May 6, 1974

[21] Appl. No.: 467,594

[30] Foreign Application Priority Data
Apr. 19, 1974 Canada................................ 197818

[52] U.S. Cl................... 317/41; 323/68; 338/22 R
[51] Int. Cl.[2] .......................................... H02H 5/04
[58] Field of Search.............. 338/22 R; 323/68, 69; 317/41

[56] References Cited
UNITED STATES PATENTS

| | | | |
|---|---|---|---|
| 3,402,131 | 9/1968 | Futaki et al. | 338/22 R |
| 3,522,480 | 8/1970 | Routh et al. | 317/41 X |

Primary Examiner—James D. Trammell
Attorney, Agent, or Firm—Spencer & Kaye

[57] ABSTRACT

A semi-conductor thermal protection arrangement is disclosed for use with class AB, B, or C power amplifiers or in any other circuit configuration wherein a reduction in drive signal at a stage prior to that of the protected semi-conductor results in a lessening of the protected semi-conductor dissipation. The arrangement comprises a temperature sensor thermally coupled with the protected semi-conductor for detecting the absolute temperature of the semi-conductor and electrically connected so as to reduce the drive signal of the semi-conductor when the temperature of such semi-conductor exceeds a predetermined temperature above the normal operating temperature of the semi-conductor.

10 Claims, 6 Drawing Figures

SEMI-CONDUCTOR THERMAL PROTECTION ARRANGEMENT

This invention relates to semi-conductor thermal protection and more particularly to the protection of semi-conductors used in class AB, B or C amplifiers or in any other circuit configuration wherein a reduction in drive signal at a stage prior to that of the protected semi-conductor results in a lessening of the protected semi-conductor dissipation.

Semi-conductors are very sensitive and can be damaged or destroyed by overheating as a result of abnormal loads, excessive drive, too high ambients, etc.

A large number of known circuit configurations incorporate, for example, a push pull transistor arrangement for driving the load operating in class AB, B, or C. Common to all such circuits is the question of thermally protecting the semi-conductors used in the push pull configuration. Because of the large number of situations susceptible of causing thermal overload, it is often difficult to anticipate all such situations in the design of such amplifiers and to provide adequate protection circuits which will restore the amplifier to normal operation upon occurrence of any one of such situations. The most commonly known protection arrangements include electromechanical or electrical devices, such as bimetallic switches, eutectics, Curie switches which disconnect the amplifier from the power source in the event of an overload. Such devices often cause undue disconnection of an amplifier which would normally work if the drive signal was reduced. Thermistors, posistors, and diode-junction devices have been used as thermal protection devices. However, the circuitry used to control such devices is usually complicated and expensive because the output of such devices is small or they require an external reference voltage source. In addition, these devices are prone to thermal oscillation in high gain configurations. More recently, voltage/current overload circuits have been disclosed for reducing the drive signal of class AB, B, or C, amplifiers when the voltage/current of the output transistors of such amplifiers exceeds a predetermined limit. One example of such circuit is disclosed in U.S. Pat. No. 3,671,879 issued June 20, 1972 and includes a shunt transistor connected in parallel with the input of the amplifier and which is rendered conductive to provide a shunt path for excess drive signal causing the output transistors of the amplifier to overheat. Such a protection circuit permits to the amplifier to operate at a safe level but requires the use of an additional transistor circuit which renders the amplifier more expensive.

It is therefore the object of the present invention to provide a simple and inexpensive arrangement for protecting semi-conductors which permits sensing of the absolute temperature of the semi-conductors and to control the power dissipation of the semi-conductors by reducing the drive signal to a safe level.

Applicant has developed a temperature sensor which exhibits a sharp change in resistance at a predetermined temperature. Such a device is made of vanadium dioxide material and is disclosed in U.S. patent application Ser. No. 335,651, filed Feb. 26, 1973.

It has now been realized that this device has all the required characteristics of a good temperature sensor for use as a thermal protection arrangement of the type described above, namely:

a. It has a very high resistance at normal operating temperature of the semi-conductor and therefore does not affect the operation of the semi-conductor at normal operating temperatures;

b. It has a sharp decrease in its resistance-temperature characteristic above the normal operating temperature of the semi-conductor but such transition region is low enough to permit sensing of the absolute temperature of the semi-conductor and to operate before the semi-conductor has overheated, such abrupt resistance change being still proportional to temperature increase in the transition region;

c. It has a purely resistive impedance and consequently has no effect on the frequency response of audio amplifiers wherein it may be used.

In addition to the above characteristics, applicants have found that their thermal sensor possesses a predetermined amount of temperature hysteresis in the transition region which automatically reduces its sensitivity in that region. If hysteresis were not present, the signal level would change much faster than the equivalent temperature of the semi-conductor in the transition region and a strong possibility would exist of the two getting 180° out of phase, causing thermal oscillation and a subsequent continuous increase and decrease of the output signal of the semi-conductor in that region.

It is to be understood that materials other than vanadium dioxide could be used. Generally, the material of the temperature sensor must satisfy the following criteria: (a) contain elements whose atoms when in chemical combination with other elements have an incompletely filled d-shell or an incompletely filled f-shell; (b) contain a substance effective to remove s- and p-electrons from the conduction bands of such atoms; (c) exhibit a sharp drop in its resistance-temperature characteristic at the above predetermined temperature; and (d) possess a predetermined amount of temperature hysteresis. Possible materials are mentioned in Canadian Patent No. 938,735 issued Dec. 18, 1973.

The semi-conductor protection arrangement, in accordance with the invention, thus comprises a temperature sensor thermally coupled with the protected semi-conductor for detecting the absolute temperature of the semi-conductor and such temperature sensor is electrically connected so as to reduce the drive signal of the semi-conductor when the temperature of such semi-conductor exceeds a predetermined temperature. The temperature sensor is made of a material of the type disclosed above having a sharp drop in its resistance-temperature characteristic at such predetermined temperature, and a predetermined amount of temperature hysteresis. Such drop is above the normal operating temperature of the semi-conductor but low enough to quickly reduce the drive signal before the semi-conductor is damaged or destroyed by overheating. The temperature hysteresis of the temperature sensor permits an automatic reduction in the sensitivity of its response for minor temperature excursions in the transition region due to variations in drive signals. The temperature sensor is also a purely resistive device which is not polarity sensitive and has virtually no reactive components. Consequently, it may be used in high quality audio amplifiers because it will not affect the frequency response.

In a transistor amplifier, the drive signal of the transistor may be reduced by controlling the gain of the amplifier, in which case the temperature sensor is electrically connected in the feedback loop of the transistor amplifier. The drive signal of the transistor may also be reduced by attenuating the input signal in which case the temperature sensor is electrically connected in shunt with the input of the amplifier.

In order to sense the absolute temperature of the semi-conductor, the temperature sensor may be mechanically connected to the semi-conductor casing so as to permit installation of the protection arrangement to an existing amplifier.

The temperature sensor used is preferably made of vanadium dioxide which has a transition temperature in the region of 56° to 70°C. However, such region may be slightly modified by proper doping of the vanadium dioxide material.

The invention will now be disclosed with reference to preferred embodiments thereof illustrated, by way of example, in the accompanying drawings in which.

Figure 1:
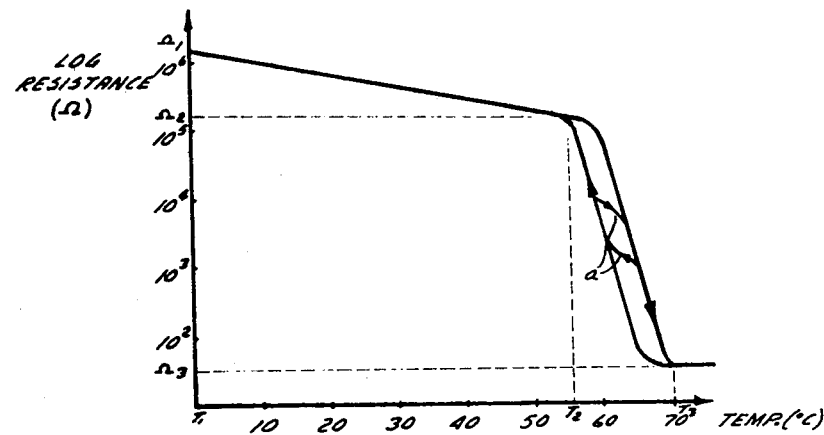
FIG. 1 illustrates the resistance-temperature characteristic of the temperature sensor used in the semiconductor protection arrangement in accordance with the invention.

Referring to FIG. 1, there is shown the resistance-temperature characteristic of a temperature sensor suitable for use in the protection of semi-conductors. The temperature sensor has a high resistance at temperature $T_1$ and an abrupt decrease in resistance in the region $T_2 - T_3$ wherein its resistance drops from a relatively high value to a relatively low value. Such transition region must be higher than the normal operating temperature of the semi-conductor to be protected but lower than the temperature at which the semi-conductor may be damaged or destroyed. One suitable material is vanadium dioxide having a transition temperature in the region of 56°C ($T_2$) to 70°C ($T_3$). One example of such a temperature sensor may be a thin film device as disclosed in U.S. patent application Ser. No. 335,651 filed Feb. 26, 1973. The transition region may be modified slightly by doping vanadium dioxide with materials selected for the group consisting of tungsten, molybdenum, titanium, niobium, germanium, silicon and carbon. One such method has been disclosed in U.S. application Ser. No. 384,505 filed Aug. 1, 1973. For example, by doping vanadium dioxide with a small amount of tungsten, the transition region has been lowered to 40° ($T_2$) to 75° ($T_3$). Doping with a small amount of germanium has moved the transition region to 50° ($T_2$) to 90°C ($T_3$). Doping with a different small amount of germanium has moved the transition region to 62° ($T_2$) to 105°C ($T_3$). It will be understood that the choice of the temperature sensor will depend on the normal operating temperature of the semi-conductor and on the acceptable overheat temperature value.

The transition region must be relatively narrow but still extend to a reasonable temperature range so as to permit control of the semi-conductor dissipation within that range. A % resistance change /°C (TCR) varying between 20%/°C to 600%/°C has been found acceptable.

The following table illustrates the characteristics of four temperature sensors developed by the applicants which have been applied successfully to the protection of semi-conductors:

TABLE 1

| Sensors | $T_1$ | $\Omega_1$ | $T_2$ | $\Omega_2$ | $T_3$ | $\Omega_3$ | TCR |
|---|---|---|---|---|---|---|---|
| TS-1 | 0°C | 1400K | 56°C | 200K | 70°C | 50 | 545%/°C |
| TS-2 | 0°C | 500K | 50°C | 100K | 90°C | 100 | 35%/°C |
| TS-3 | 0°C | 170K | 62°C | 25K | 105°C | 120 | 24%/°C |
| TS-4 | 0°C | 160K | 40°C | 70K | 75°C | 65 | 57%/°C |

The above temperature sensors developed by the applicants also have a certain amount of temperature hysteresis in the transition region as illustrated in FIG. 1. Such hysteresis has a width of about 5°C and this has been found to be greatly desirable to insure the stability of the thermal protection arrangement to be disclosed later. The percent resistance change /°C in the transition region is much reduced as indicated by $a$.

The above temperature sensors are also purely resistive and have virtually no reactive components. Therefore their impedance does not vary with frequency and this renders them very desirable for use with audio amplifiers.

Figures 2, 6:
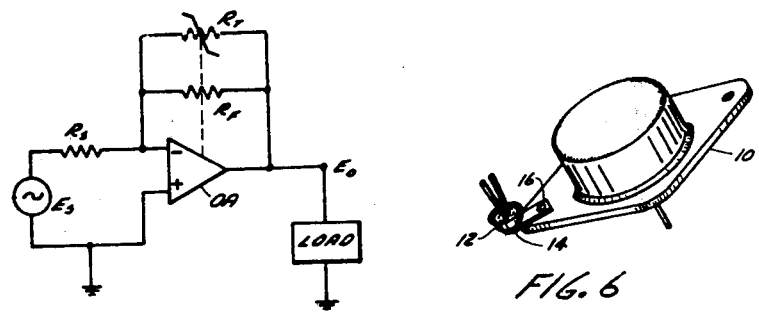
FIG. 2 illustrates a schematic diagram of a first circuit for controlling the drive signal of an amplifier.
FIG. 6 illustrates a method of mounting the temperature sensor to the semi-conductor to be protected.

Referring to FIG. 2, there is shown a schematic diagram of a first circuit for reducing the drive signal of an amplifier in response to overheating of its output transistors. The amplifier is an operational amplifier OA having a resistor $R_F$ determining the loop gain thereof in a known manner. A signal source $E_S$ having an internal impedance $R_S$ is fed to the negative terminal of the operational amplifier whereas the positive terminal is grounded. The loop gain of the operational amplifier is controlled by the temperature sensor $R_T$ which is thermally coupled with the output transistors of the amplifier as indicated by the dash line, and electrically connected across the resistor $R_F$. As it will be easily understood, the resistance of the temperature sensor $R_T$, at the normal operating temperature of the transistors of the amplifier, is very high compared with the resistance of resistor $R_F$ and has little or no effect on the loop gain of the operational amplifier. However, when the temperature of the output transistor increases beyond the value $T_2$ the resistance of the temperature sensor $R_T$ is lowered thus effecting the gain of the amplifier and there will be a sharp decrease in drive signal of the output transistors of the operational amplifier due to the variation in the loop gain and, consequently, a reduction in the rate at which the output transistors overheat (power dissipation). Eventually, the input drive of the output transistors will be reduced to a point where no additional heating takes place and the entire system will stabilize somewhere in the transition region. The temperature at which the drive signal stabilizes will always be the optimum operating point with a given thermal overload condition. As the thermal overload condition changes, the operating point will automatically change accordingly. Operation in the transition region therefore differs from normal operation only in regard to signal amplitude.

Thermal oscillation is precluded up to a certain degree because of the temperature hysteresis of the temperature sensor. If this hysteresis were not present, power level would change much faster than the equivalent transistor temperature, and a strong possibility would exist of the two getting 180° out of phase. Since hysteresis is present, the rate of variation in the resistance of the temperature sensor is automatically reduced within the transition region, as indicated by minor hysteresis portion $a$ in FIG. 1. Accordingly, oscillation will only occur if the 180° phase can be obtained despite the much lower percent resistance change /°C in that region and this is not likely to happen under most overload conditions. It can therefore be said that a temperature sensor having a temperature hysteresis limits agressively but controls smoothly. Thus the hysteresis ensures high sensitivity to abnormal temperature conditions and a somewhat lower sensitivity when operating in the control mode within the transition region. These advantages are significant and contribute to the realization of a transistor protection arrangement which is simple and inexpensive.

Figure 3:
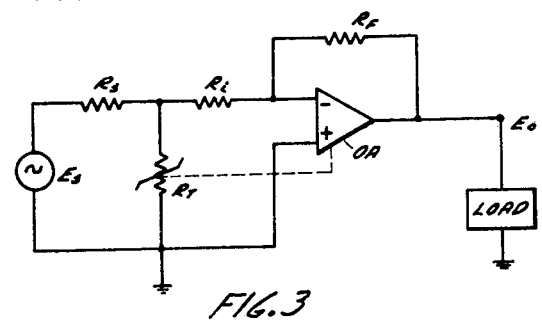
FIG. 3 illustrates a schematic diagram of a second circuit for controlling the drive signal of an amplifier.

FIG. 3 illustrates a second schematic embodiment of the invention wherein corresponding elements are designated by the same reference character as the embodiment of FIG. 2. However, the temperature sensor $R_T$ is electrically connected in an input shunt circuit instead of being placed in the negative feedback loop. The operation is the same as that of FIG. 2 except that instead of controlling the loop gain, a portion of the drive signal is shunted across the input of the amplifier. As it will be easily understood, any increase of the temperature of the transistor past temperature $T_2$ will lower the impedance of resistor $R_T$ and an increasing portion of the drive signal will be shunted across the input of the amplifier. This will automatically reduce the drive of the output transistor and the temperature of the output transistor will stabilize between $T_2$ and $T_3$.

Figure 4:
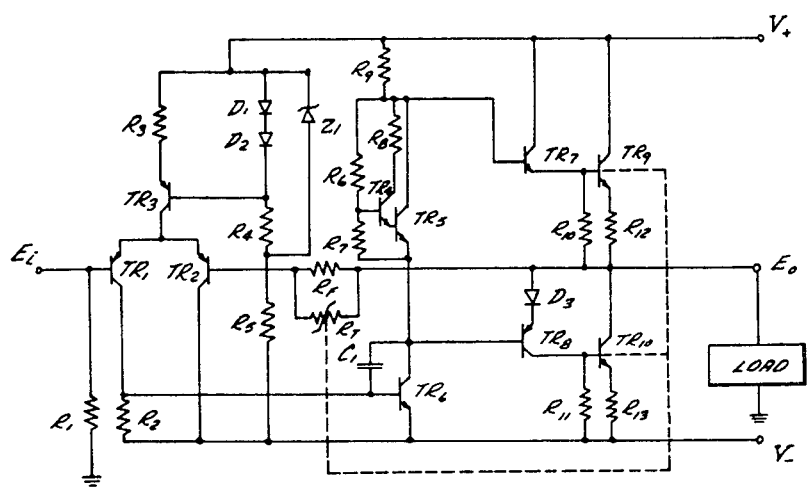
FIG. 4 illustrates the detailed circuit diagram of FIG. 2.

FIG. 4 illustrates the circuitry of a known power amplifier which is provided with a protection arrangement in accordance with the invention. The power amplifier comprises a differential amplifier including PNP transistors $TR_1$ and $TR_2$ driven from a constant current source provided by PNP transistor $TR_3$ which has its collector connected to the emitters of transistors $TR_1$ and $TR_2$. The differential amplifier also includes resistors $R_1$ to $R_5$, diodes $D_1$ and $D_2$ and Zener diode $Z_1$. Resistor $R_1$ is the input resistor and is connected between ground and the base of transistor $TR_1$. Resistor $R_2$ is the load resistor of transistor $TR_1$ and is connected between the collector of transistor $TR_1$ and D.C. source $V_-$. Resistor $R_3$ is the emitter biasing resistor of transistor $TR_3$ and is connected between the emitter of transistor $TR_3$ and the D.C. source $V_+$. Diodes $D_1$ and $D_2$ and resistors $R_4$ and $R_5$ are connected in series across D.C. sources $V_+$ and $V_-$ and together with Zener diode $Z_1$ connected across diodes $D_1$ and $D_2$ and resistor $R_4$, establish the proper biasing potential for transistor $TR_3$, the base of which is connected between diode $D_2$ and resistor $R_4$.

NPN transistors $TR_4$ and $TR_5$ are used to provide the proper base potential for NPN driver transistor $TR_7$ and PNP driver transistor $TR_8$ which drive NPN output transistors $TR_9$ and $TR_{10}$ respectively. Transistors $TR_4$ and $TR_5$ are biased by resistors $R_6$, $R_7$, and $R_8$. The base of transistor $TR_5$ is connected to the emitter of transistor $TR_4$. Resistors $R_6$ and $R_7$ are connected in series across the collector and emitter electrodes of transistor $TR_5$ and the base of transistor $TR_4$ is connected to the junction of resistors $R_6$ and $R_7$. Resistor $R_8$ has one terminal connected to the collector of transistor $TR_4$ and its other terminal connected to the junction of resistor $R_6$ and the collector of transistor $TR_5$. A pre-driver NPN transistor $TR_6$ is provided for driving output transistors $TR_9$ and $TR_{10}$ and the collector-emitter electrodes of such transistor are connected in series with the collector-emitter electrodes of transistor $TR_5$. The collector-emitter electrodes of transistors $TR_5$ and $TR_6$ are connected across D.C. sources $V_+$ and $V_-$ through resistor $R_9$. The base emitter potential of transistor $TR_6$ is derived from load resistor $R_2$ of transistor $TR_1$. A capacitor $C_1$ is connected across the base-collector electrodes of transistor $TR_6$ to reduce the high frequency response of the amplifier.

As commonly known, transistors $TR_9$ and $TR_{10}$ form a push-pull amplifier and are driven by complementary drive signals produced by driver transistors $TR_7$ and $TR_8$ respectively. The drive signals for driver transistors $TR_7$ and $TR_8$ are fed by pre-driver transistor $TR_6$ under the control of the differential amplifier formed by transistors $TR_1$ and $TR_2$. The two stages formed by transistors $TR_7$ and $TR_9$ and transistors $TR_8$ and $TR_{10}$ have a common output terminal Eo to which a load may be connected. The collectors of transistors $TR_7$ and $TR_9$ are connected to D.C. source $V_+$. The emitter electrode transistor $TR_7$ is connected to the base electrode of transistor $TR_9$ and a biasing resistor $R_{10}$ is connected between the junction of such electrodes and the output terminal $E_o$. A load resistor $R_{12}$ is connected between the emitter of transistor $TR_9$ to stabilize the performance of the transistor. The collector of transistor $TR_{10}$ is connected directly to output $E_o$ while the emitter of transistor $TR_8$ is connected to output $E_o$ through diode $D_3$. The collector electrode of transistor $TR_8$ is connected to the base electrode of transistor $TR_{10}$ and a resistor $R_{11}$ is connected between the junction of such electrodes and the D.C. source $V_-$. A load resistor $R_{13}$ is connected between the emitter of transistor $TR_{10}$ and the source $V_-$ to stabilize the output of the transistor.

A portion of the output $E_o$ is fed back to the base of the transistor $TR_2$ of the differential amplifier to control the gain of the amplifier and thereby the drive of the output transistors $TR_9$ and $TR_{10}$ through pre-driver transistor $TR_6$ and driver transistors $TR_7$ and $TR_8$. The amount of feedback is controlled by the resistance value of resistor $R_F$ which is the same as illustrated schematically in FIG. 2 of the drawings. It will be clearly understood that by connecting the temperature sensor $R_T$ in parallel with resistor $R_F$, the signal fed back to the transistor $TR_2$ may be increased so as to reduce the drive of the output transistors $TR_9$ and $TR_{10}$. In this way, the output transistors will be less overheated and the operation of the output transistors may thus be stabilized between temperatures $T_2$ and $T_3$.

Figure 5:
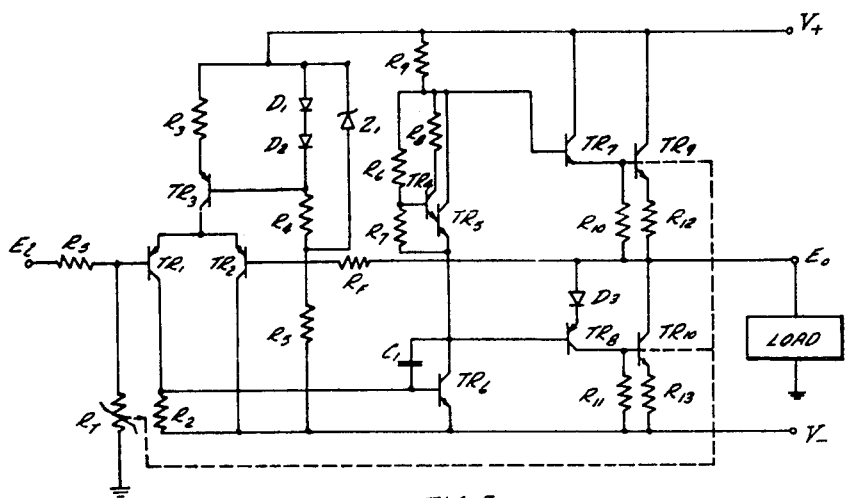
FIG. 5 illustrates the detailed circuit diagram of FIG. 3.

FIG. 5 illustrates the same amplifier as in FIG. 4 with the exception that the temperature sensor $R_T$ is replacing input resistor $R_1$. As illustrated schematically in FIG. 3, any increase in resistance $R_T$ above $T_2$ will shunt a portion of the input signal fed to the transistor $TR_1$ and so reduce the drive signal fed to output transistors $TR_9$ and $TR_{10}$. Such a reduction of the drive signal fed to transistors $TR_9$ and $TR_{10}$ will stabilize the temperature of the output transistor between $T_2$ and $T_3$.

Although the above protection arrangement has been disclosed with reference to a particular amplifier configuration, it is to be understood that it may be used with a number of amplifiers or in any circuit configuration wherein a reduction in drive signals at a stage prior to that of the protected semi-conductor results in a lessening of the protected semi-conductor dissipation. Possible applications include audio amplifiers, bench power supplies, mobile transmitters, etc. The above protection arrangement is also not limited to the protection of transistors but may also be applied to the protection of various types of semi-conductors usable in the above mentioned circuit configurations.

In the above description, it was mentioned that the temperature sensor $R_T$ must be thermally coupled with the semi-conductor to be protected. This may be done in a number of ways including deposition of thin film layers of the sensor material on the same substrate as the semi-conductor. An alternate approach is to mount a temperature sensor chip on the same substrate or base to which the semi-conductor is attached. The same effect may be achieved by forming a thick film version of the temperature sensor on the same substrate as the semi-conductor is mounted on or in a position where it is very closely coupled thermally to the semi-conductor. However, FIG. 6 illustrates a method of mechanically mounting a temperature sensor right on an existing power transistor casing 10. The header 12 of the temperature sensor is provided with a tab 14 welded or otherwise secured thereto and such tab 14 is secured to the transistor casing using the screws 16 which are normally used for securing the transistor casing to a suitable base. These are just some of the ways that this concept can be employed by anyone skilled in the art can conceive of may other ways of thermally coupling one of these temperature sensors to a semi-conductor to protect the semi-conductor from overheating.

What is claimed is:

1. A semi-conductor protection arrangement for use with class AB, B or C power amplifiers or in any other circuit configuration wherein a reduction in drive signal at a stage prior to that of the protected semi-conductor results in a lessening of the protected semi-conductor dissipation, said arrangement comprising a temperature sensor thermally coupled with the protected semi-conductor for detecting the absolute temperature of the semi-conductor and electrically connected so as to reduce the drive signal of the semi-conductor when the temperature of said semi-conductor exceeds a predetermined temperature above the normal operating temperature of the semi-conductor, said temperature sensor being made of a material which satisfies the following criteria: (a) contains elements whose atoms when in chemical combination with other elements have an incompletely filled d-shell or an incompletely filled f-shell; (b) contains a substance effective to remove s- and p- electrons from the conduction bands of such atoms; (c) exhibits a sharp drop in its resistance-temperature characteristic at the above predetermined temperature; and (d) possesses a sufficient predetermined amount of temperature hysteresis, so that the temperature sensor reacts quickly to an increase in temperature above said predetermined temperature but reacts at a slower rate for minor temperature excursions in the transition region thus preventing thermal oscillation of the semi-conductor protection arrangement within the transition region.

2. A semi-conductor protection arrangement as defined in claim 1, wherein the temperature sensor is used to control the dissipation of the output transistor of an amplifier and is located in a gain determining feedback loop of the amplifier.

3. A semi-conductor protection arrangement as defined in claim 1, wherein the temperature sensor is used to control the dissipation of the output transistor of an amplifier and is located in a shunt path across the input of the amplifier.

4. A semi-conductor protection arrangement as defined in claim 1, wherein said predetermined amount of hysteresis is about 5°C.

5. A semi-conductor protection arrangement as defined in claim 1, wherein said temperature sensor is mechanically connected to the semi-conductor mounting so as to permit easy installation of the protection arrangement to an existing circuit configuration.

6. A semi-conductor protection arrangement as defined in claim 1, wherein said material is vanadium dioxide having a sharp transition region extending from 55° to 70°C.

7. A semi-conductor protection arrangement as defined in claim 6, wherein the transition region may be varied to extend from 40° to 75°C by doping the vanadium dioxide material with a suitable doping material.

8. A semi-conductor protection arrangement as defined in claim 6, wherein the transition region may be varied to extend from 50° to 90° by doping the vanadium dioxide material with a suitable doping material.

9. A semi-conductor protection arrangement as defined in claim 6, wherein the transition region may be varied to extend from 62° to 105°C by doping the vanadium dioxide material with a suitable doping material.

10. A semi-conductor protection arrangement as defined in claim 1, wherein the transition region of the temperature sensor is selected so as to maintain the semi-conductor at maximum safe operating power.

* * * * *